US009018678B2

(12) United States Patent
Daval et al.

(10) Patent No.: US 9,018,678 B2
(45) Date of Patent: Apr. 28, 2015

(54) METHOD FOR FORMING A GE ON III/V-ON-INSULATOR STRUCTURE

(75) Inventors: Nicolas Daval, Lumbin (FR); Bich-Yen Nguyen, Austin, TX (US); Cecile Aulnette, Crolles (FR); Konstantin Bourdelle, Crolles (FR)

(73) Assignee: Soitec, Bernin (FR)

( * ) Notice: Subject to any disclaimer, the term of this patent is extended or adjusted under 35 U.S.C. 154(b) by 189 days.

(21) Appl. No.: 13/399,273

(22) Filed: Feb. 17, 2012

(65) Prior Publication Data
US 2012/0228672 A1 Sep. 13, 2012

(30) Foreign Application Priority Data
Mar. 9, 2011 (FR) ...................... 11 51939

(51) Int. Cl.
*H01L 29/78* (2006.01)
*H01L 29/786* (2006.01)
*H01L 21/762* (2006.01)
*H01L 29/66* (2006.01)

(52) U.S. Cl.
CPC .... *H01L 29/78681* (2013.01); *H01L 21/76254* (2013.01); *H01L 29/66742* (2013.01); *H01L 29/78618* (2013.01); *H01L 29/78684* (2013.01)

(58) Field of Classification Search
USPC ............... 257/192, 200, 201, 289, E29.27
See application file for complete search history.

(56) References Cited
U.S. PATENT DOCUMENTS

| 7,232,743 | B2 | 6/2007 | Aulnette et al. | |
|---|---|---|---|---|
| 7,964,896 | B2 | 6/2011 | Kiewra et al. | |
| 2005/0167002 | A1 | 8/2005 | Ghyselen et al. | 148/33 |
| 2005/0170611 | A1 | 8/2005 | Ghyselen et al. | 438/458 |
| 2006/0083280 | A1 | 4/2006 | Tauzin et al. | 372/46.01 |
| 2007/0105335 | A1* | 5/2007 | Fitzgerald | 438/405 |
| 2007/0231488 | A1 | 10/2007 | Von Kaenel | 427/255.15 |
| 2008/0132031 | A1* | 6/2008 | Aulnette et al. | 438/455 |
| 2010/0025728 | A1 | 2/2010 | Faure | 257/190 |
| 2010/0155701 | A1* | 6/2010 | Radosavljevic et al. | 257/24 |

FOREIGN PATENT DOCUMENTS

| CN | 1538499 A | 10/2004 |
|---|---|---|
| CN | 101449366 A | 6/2009 |
| EP | 2270840 A1 | 1/2011 |
| JP | 59172776 A | 9/1984 |

(Continued)

OTHER PUBLICATIONS

Chinese Office Action for Chinese Application No. 201210022444.6 dated Aug. 14, 2014, 10 pages.

*Primary Examiner* — Minchul Yang
(74) *Attorney, Agent, or Firm* — TraskBritt

(57) ABSTRACT

The present invention concerns a method for forming a Semiconductor-On-Insulator structure that includes a semiconductor layer of III/V material by growing a relaxed germanium layer on a donor substrate; growing at least one layer of III/V material on the layer of germanium; forming a cleaving plane in the relaxed germanium layer; transferring a cleaved part of the donor substrate to a support substrate, with the cleaved part being a part of the donor substrate cleaved at the cleaving plane that includes the at least one layer of III/V material. The present invention also concerns a germanium on III/V-On-Insulator structure, an N Field-Effect Transistor (NFET), a method for manufacturing an NFET, a P Field-Effect Transistor (PFET), and a method for manufacturing a PFET.

13 Claims, 3 Drawing Sheets

(56) References Cited

FOREIGN PATENT DOCUMENTS

| | | |
|---|---|---|
| JP | 59211222 A | 11/1984 |
| JP | 5160157 A | 6/1993 |
| JP | 2006-121091 A | 5/2006 |
| JP | 2006-518544 A | 8/2006 |
| WO | WO2007/014958 A1 | 2/2007 |

* cited by examiner

METHOD FOR FORMING A GE ON III/V-ON-INSULATOR STRUCTURE

FIELD OF THE INVENTION

The field of the invention is that of Semiconductor-On-Insulator structures enabling the formation of high-mobility channel transistors.

More precisely, the invention relates to an improved method for making such structures.

BACKGROUND OF THE INVENTION

During the past forty years, microelectronic technology has been able to shrink the dimensions of its basic element, namely the transistor, and thus to increase the density of transistors in circuits, as well as to improve the performance of each transistor. This increase is found to follow a very well known exponential curve called "Moore's law." For the first part of this curve, the performance increase was directly derived from the smaller dimensions of the transistor, but for the last ten years, high-performance silicon-based Complementary Metal-Oxide Semiconductor (CMOS) technology has relied heavily on material innovations at the transistor level to maintain generational performance trends.

One aspect of the material innovations was to increase the strain in the silicon crystal to boost carrier mobility and thus to reach high current density, which directly transfers into higher performance for the circuit. This aspect has been pushed to its limits for the last generation of improvements, so now it is either inconceivable to continue to build more strain or the mobility increase saturates even if more strain is applied. Despite this limitation, the need to gain more performance through carrier mobility gain remains.

Field-effect type transistors (FETs) rely on an electric field to control the shape and, hence, the conductivity of a channel of one type of charge carrier in a semiconductor material. While silicon has typically been used in the channels of such transistors, new higher-mobility materials are expected to replace silicon. The most studied high mobility materials for N Field-Effect Transistors (NFETs) are III/V materials, and in particular GaAs and InGaAs. Pure Ge or SiGe alloys are usually contemplated for P Field-Effect Transistors (PFETs). Manufacturing structures comprising such new materials, and in particular Semiconductor-On-Insulator (SeOI) structures, however, remains problematic.

SeOI structures comprise one or more thin layers of semiconductor materials on a buried insulating layer, covering a support substrate, generally made of silicon. But, silicon, on the first hand, and GaAs or InGaAs, on the other hand, are crystalline materials having very different lattice parameters which do not easily match. A layer of InGaAs grown on a silicon substrate therefore presents crystal defects, misfits and dislocations which drastically reduce performances, unless a very thick buffer layer is grown from a silicon substrate to accommodate the large difference in lattice parameter. The growing of such a thick layer is both time consuming and expensive.

Alternatively, support substrates that are more compatible, for example, made of GaAs or InP, do exist, but these alternative substrates are expensive and are available only in limited diameters (e.g., a maximum of 150 mm InP wafers compared with 300 mm silicon wafers). All of these solutions are, therefore, not useful for the manufacture of high-yield microelectronic devices.

Moreover, moving away from silicon to high-mobility materials implies that two different SeOI structures would be required for N or P FETs, whereas silicon is useful for either one.

Finally, there is another major obstacle to form a conventional III/V transistor with implanted source and drain. Indeed, a transistor needs three electrodes, two of then being connection points with the semiconductor material in a FET (at the source and the drain). But, due to doping implantation defects that are impossible to heal, metallic contacts with III/V materials present a high resistance, which also reduces performance.

There is consequently a need for SeOI structures that enable high-yield manufacturing of a III/V high-mobility channel transistors, with low access resistance source and drain contacts, as well as methods of making such structures. These are now provided by the present invention.

SUMMARY OF THE INVENTION

The present invention now provides a method for forming a Semiconductor-On-Insulator (SeOI) structure that includes a semiconductor layer of III/V material. This method comprises providing a relaxed germanium layer on a donor substrate; providing at least one layer of III/V material on the layer of germanium; providing a cleaving plane in the relaxed germanium layer; and transferring part of the donor substrate to a support substrate, with the part of the donor substrate being that which is cleaved at the cleaving plane and includes the at least one layer of III/V material. A preferred III/V material is InGaAs, while the donor substrate can be made of silicon.

As the structure is realized from silicon support substrates, industrial 300 mm wafers can be manufactured. High-yield, low-cost production is possible. Moreover, the Ge layer can be used to form low-resistance contacts, as Ge-III/V heterojunctions are known as being of the non-Schottky-type (no potential barrier appears at the junction). A source and a drain then can be implanted in the Ge layer.

The providing of the relaxed germanium layer advantageously comprises growing a silicon germanide buffer layer of lattice adaptation on the donor substrate, and then growing the relaxed germanium layer on the silicon germanide buffer layer. Also, the providing of the cleaving plane in the relaxed germanium layer advantageously comprises forming an insulating layer on the at least one layer of III/V material or on the support substrate. The providing of the insulating layer advantageously comprises forming an oxide by thermal oxidation of the support substrate. Alternatively, the forming of the insulating layer comprises depositing an oxide layer on the at least one layer of III/V material. The providing of the at least one layer of III/V material on the layer of germanium further comprises forming a thin silicon layer on the at least one layer of III/V material. The support substrate is preferably a Silicon-On-Insulator (SOI) structure comprising an insulating layer.

Another embodiment relates to a germanium on III/V-On-Insulator (Ge-III/V-OI) structure comprising a support substrate, an insulating layer on the support substrate, at least one layer of III/V material on the insulating layer, and a germanium layer on the at least one layer of III/V material.

Furthermore, this Ge-III/V-OI structure facilitates the formation of both N Field-Effect Transistors (NFETs) and P Field-Effect Transistors (PFETs). The NFET comprises a gate in a cavity in the germanium layer extending to the at least one layer of III/V material, the gate being insulated from the germanium layer and the III/V layer(s) by a high-K dielectric material; a source region in the germanium layer on a first side portion of the cavity; and a drain region in the germanium layer on an opposite side portion of the cavity. The PFET transistor comprises an island on the germanium layer, the island comprising a gate insulated from the germanium layer by a high-K dielectric material; a source region in the germanium layer on a first side of the island; and a drain region in the germanium layer on another other side of the island.

Additional embodiments relate to methods of manufacturing of the NFETs and PFETs. The method for manufacturing an NFET comprises providing a cavity in the germanium layer of one of the Ge-III/V-OI structures disclosed herein, with the cavity extending to the layer of III/V material; depositing in the cavity a high-K dielectric material and a gate, with the gate being insulated from the germanium layer and the layer of III/V material by the high-K dielectric material; and implanting a source region and a drain region in the germanium layer on each side of the cavity. The method for manufacturing a PFET comprises forming an island on the germanium layer of the Ge-III/V-OI structures disclosed herein, depositing a high-K dielectric material and a gate, with the gate being insulated from the germanium layer by the high-K dielectric material; and implanting a source region and a drain region in the germanium layer on a side of the island. For the latter method, the Ge-III/V-OI structure is generally formed by growing a silicon germanide buffer layer of lattice adaptation on the donor substrate, with the relaxed germanium layer being grown on the silicon germanide buffer layer, thereafter forming a cavity in the buffer layer that extends to the germanium layer before forming the island, with the gate being insulated from the buffer layer by the high-K dielectric material. Also, that method may include partially recessing the germanium layer before forming the island.

BRIEF DESCRIPTION OF THE DRAWINGS

The above and other objects, features and advantages of this invention will be apparent in the following detailed description of an illustrative embodiment thereof, which is to be read in connection with the accompanying drawings wherein.

DETAILED DESCRIPTION OF PREFERRED EMBODIMENTS

III/V Layer on Si/Ge Donor

Figure 1:
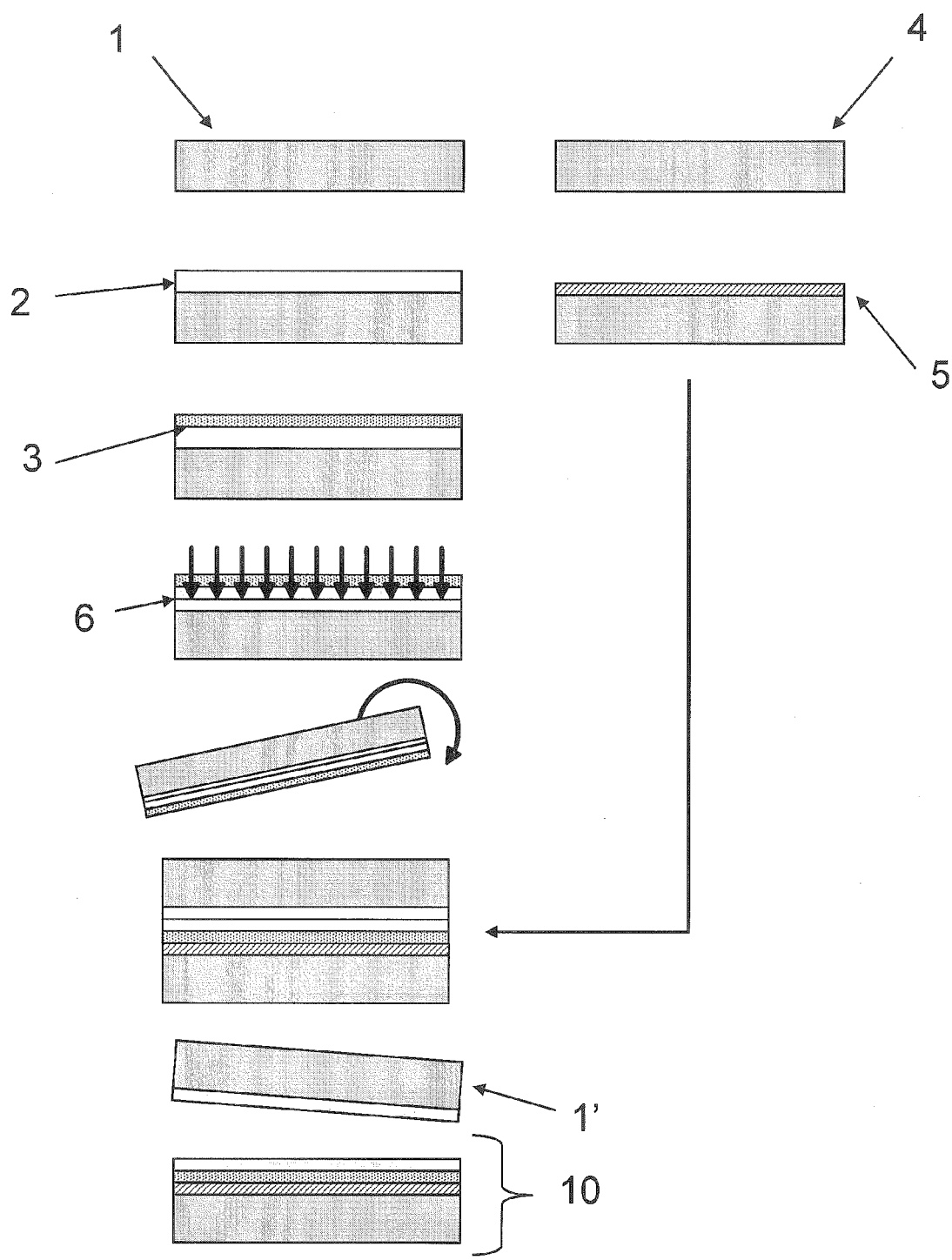
FIG. 1 represents steps of an embodiment of a method according to the first aspect of the invention.

Referring to the drawings, a method according to a possible embodiment of the invention will now be described.

The invention proposes to intercalate a layer of relaxed germanium 2 between a donor substrate 1, advantageously made of silicon, and at least one layer 3 of III/V material, the III/V material being, for example, InP, AsGa, InAs and advantageously InAsGa, because of its charge carrier high mobility. Indeed, lattices of Ge and III/V materials are close enough to allow for the growth of a III/V material layer on top of the relaxed Ge layer without lattice accommodation issues. Moreover, methods for growing a relaxed Ge layer on top of a silicon donor substrate are generally within the knowledge of a skilled artisan.

A layer is "relaxed" if its crystalline material has a lattice parameter substantially identical to its nominal lattice parameter, wherein the lattice parameter of the material is in its equilibrium form without stress applied on it. Conversely, a layer is "strained" if its crystalline material is elastically stressed in tension or in compression. For example, a strained layer can be obtained by epitaxial growth of one material onto a second material when the two materials have different lattice parameters. As germanium and silicon have different lattice parameters, a first method for growing a relaxed Ge layer on top of a silicon substrate is to grow a layer of lattice adaptation, made of germanium strained at its base (the thin Ge layer will have the same in-plane lattice parameter as silicon, therefore highly strained due to the 4% mismatch between the lattice parameter) and which gradually relaxes as the thickness of the Ge layer is increased. After a sufficient thickness of at least about 2 µm is achieved, the growing germanium becomes totally relaxed.

Alternatively, a silicon germanide buffer layer 7 of lattice adaptation can be used. This buffer layer 7 is grown on the silicon donor substrate 1 before growing the relaxed germanium layer, and is made of relaxed SiGe, with an increasing proportion of germanium as the thickness of the buffer layer 7 increases. Thus, at its interface with the silicon donor substrate 1, the buffer layer 7 is essentially made of silicon, and at its interface with the relaxed germanium layer 2, the buffer layer 7 comprises a sufficient proportion of germanium for enabling the growth of pure relaxed germanium without lattice adaptation issues. This technique usually requires a buffer layer 7 that has a thickness of about 2 to 5 microns.

Alternatively, the entire donor substrate may be made of SiGe, so that it can act as a lattice adaptation layer. The relaxed germanium layer can then be directly grown on this SiGe donor substrate.

Formation of a SeOI Structure

Steps of an embodiment of the method for forming a semiconductor-on-insulator structure 10 that includes a semiconductor layer 3 of III/V material according to the invention are represented by FIG. 1.

The relaxed germanium layer 2 is grown on the donor substrate 1, as explained previously. Then at least one layer 3 of III/V material, advantageously a layer of InAsGa, is grown on the germanium layer 2.

Figure 2:
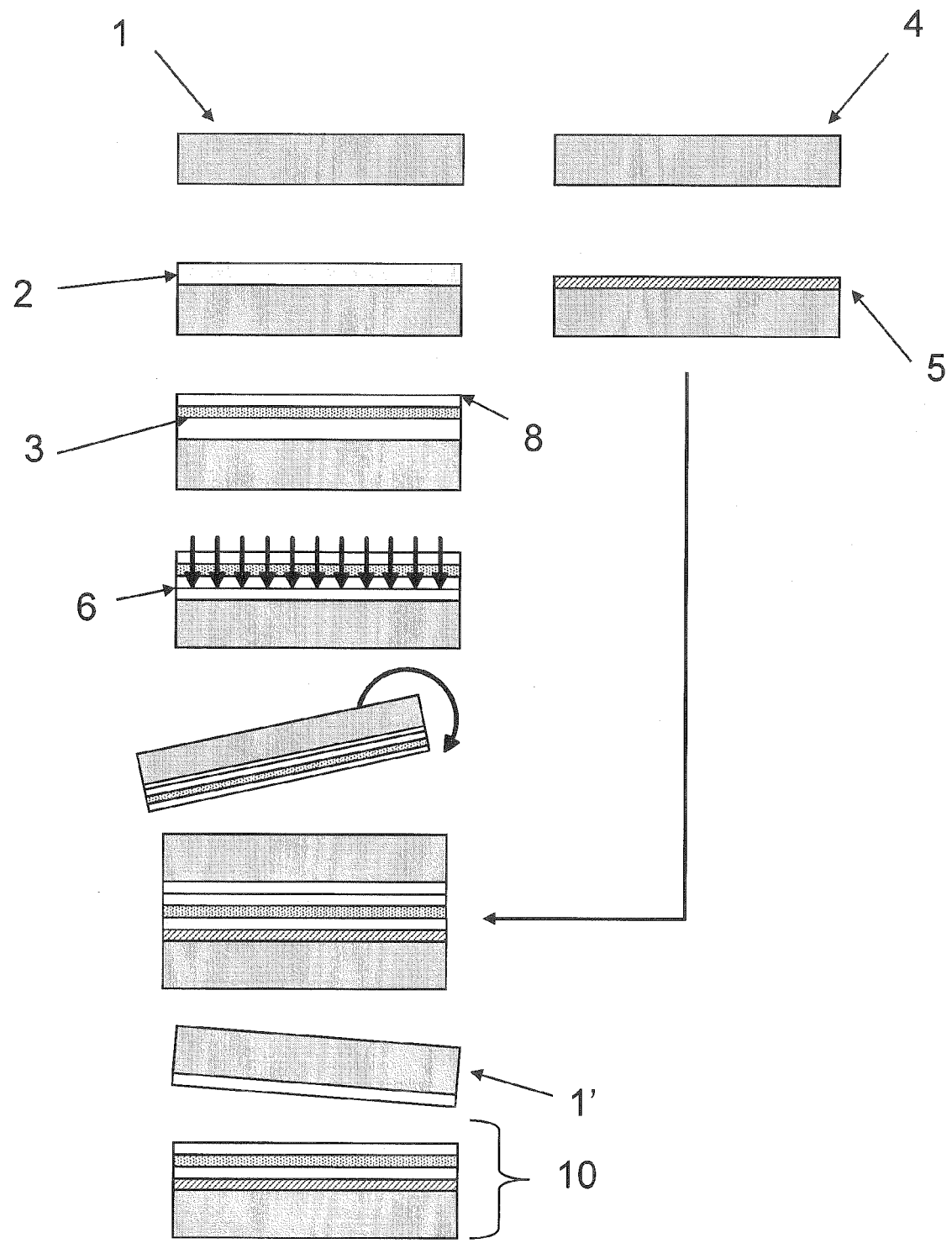
FIG. 2 represents steps of another embodiment of a method according to the first aspect of the invention.

A support substrate 4 is also prepared, with the support substrate 4 being advantageously made of silicon although any other materials typically used for substrates would also be suitable. The support substrate 4 may be a standard Silicon-On Insulator (SOI) substrate, comprising an insulating layer 5 of an oxide that is buried under a thin silicon top layer 8 (FIG. 2). If the support substrate 4 does not have an SOI structure, in other words if the support substrate 4 does not comprise an insulating layer 5, the insulating layer 5 may advantageously be formed on the at least the layer 3 of III/V material. Alternatively, the insulating layer 5 can be formed on the support substrate 4. In the embodiment represented by FIG. 1, the insulating layer 5 is conveniently formed by a thermal oxidation of the support substrate 4. For example, if the support substrate 4 is made of silicon, a silicon dioxide insulating layer is formed. Alternatively, the insulating layer 5 can be deposited directly upon the III/V material layer 3.

Oxides are also preferred for use as an insulating layer and, advantageously, an oxide layer is formed or deposited on both surfaces. Indeed, oxide/oxide bonding is known to provide good quality bonding. Alternatively, it is also possible to form a thin silicon layer 8 on the III/V material layer 3 prior to the formation of the at least one insulating layer 5, thus an SOI understructure is reconstituted when donor and support substrates 1, 4 are bonded. This embodiment is represented by FIG. 2.

A cleaving plane 6 is then formed in the relaxed germanium layer 2. This can be performed before the step of providing or forming of the insulating layer 5, or even simultaneously if the insulating layer 5 is formed only on the support substrate 4. To this end, the relaxed germanium layer 3 is, for example, implanted according to the SMARTCUT® layer transfer technology using ionic species such as hydrogen and helium. The implantation of these species leads to the creation of a cleaving plane 6, which is a buried, weakened zone. Furthermore, the donor substrate 1 is bonded with the support substrate 4 and then separated by cleaving the source substrate 1 at a depth corresponding to the penetration depth of the implanted species (i.e., at the cleaving plane 6) and in the germanium layer 2. Advantageously, if the germanium layer 2 has been grown on a silicon germanide buffer layer 7, the cleaving plane 6 can be formed in this sub-layer 7.

In this way, an SeOI structure 10 (and, more precisely, a Ge-III/V-OI structure) is obtained, the SeOI structure contains the support substrate 4 and a cleaved part of the donor substrate 1 that comprises the at least one layer 3 of III/V material and a residue of the germanium layer 2 (or if applicable the germanium layer 2 and a residue of the germanide buffer layer 7). A remaining delaminated substrate 1' being part of the former source substrate 1, possibly topped by a residue of the germanium layer 2 (or if applicable a residue of the germanide buffer layer 7) is also produced.

As for the bonding, it is possible to do so with or without activation (in particular in the case of a oxide/oxide contact), but the preferred option is Chemical-Mechanical Polishing (CMP) activation bonding.

Ge-III/V-OI Structure

According to a second aspect of the invention, a Ge-III/V-OI structure is provided, the structure being formed according to the method for forming the SeOI structure 10, as previously described.

The Ge-III/V-OI structure 10 comprises a support substrate 4, an insulating layer 5, an at least one layer 3 of III/V material on the insulating layer 5, and a germanium layer 2 on the at least one layer 3 of III/V material.

In an especially advantageous way, the SeOI structure 10 finally comprises from the bottom to the top:
 a silicon substrate 4;
 a silicon oxide insulating layer 5 (optionally next including a thin silicon layer 8);
 an InAsGa layer 3;
 a relaxed Ge layer 2; and
 a residual germanide buffer layer 7.

NFET Transistor

Figure 3:
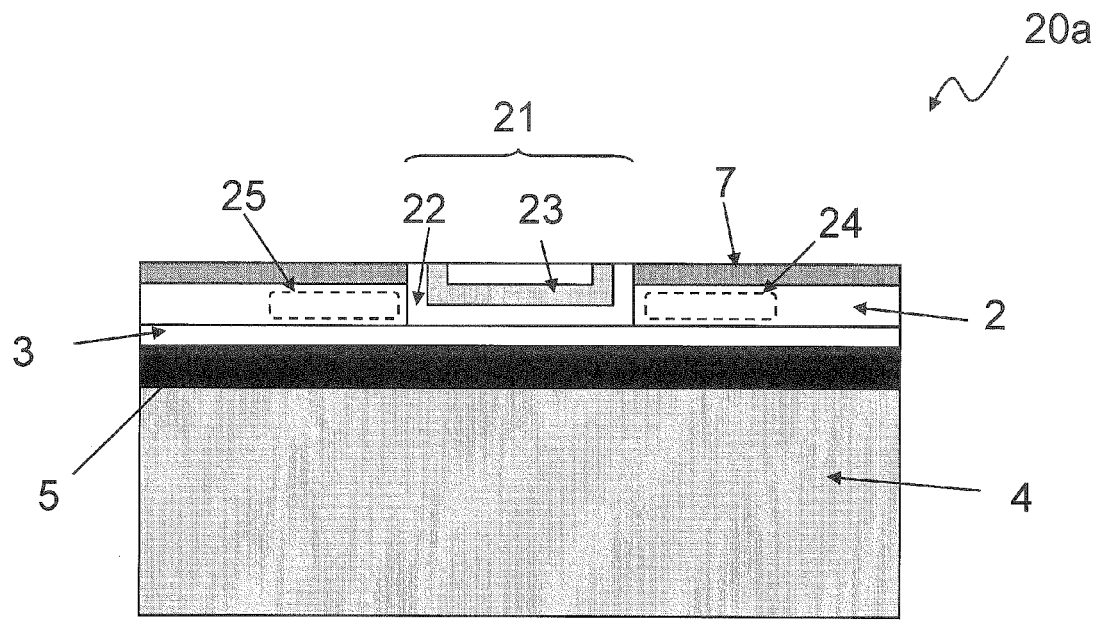
FIG. 3 is a transversal view of an NFET manufactured by an embodiment of a method according to the second aspect of the invention.

According to additional aspects of the invention, an NFET transistor 20a manufactured from a Ge-III/V-OI structure 10 as previously described and a method for manufacturing such an NFET transistor 20a are respectively provided. Such a high-performance NFET transistor 20a is represented in FIG. 3. As already explained, FETs rely on an electric field to control the shape and, hence, the conductivity of a channel of one type of charge carrier in a semiconductor material. In the N-type (negative) arrangement, the charge carriers are the electrons. So, a semiconductor is P-doped (or undoped if operated under fully depleted conditions), and when activated an N-channel forms and current can circulate.

To manufacture such an NFET transistor 20a, the Ge-III/V-OI structure 10 is formed in a first step. Then a cavity 21 is formed in the germanium layer 2 extending down to the III/V material layer 3. By this cavity 21, the germanium layer 2 is separated into two parts only linked by the InAsGa layer 3 typically undoped for fully depleted operation mode. A layer of a high-K dielectric material 22 is then first deposited. The term high-K dielectric refers to a material with a high dielectric constant K (as compared to silicon dioxide). In order to avoid leakage currents due to tunneling, the use of specific insulating materials is required. The gate 23 is then deposited, and covered with high-K dielectric material 22. The gate 23 is advantageously made of metal, and is insulated from other layers by the high-K dielectric material 22.

Finally, a source region 24 and a drain region 25 are formed by implanting in the two parts of the germanium layer 2 separated by the cavity 21. Indeed, as already explained, the Ge layer is used to form low-resistance contacts, as a Ge-III/V heterojunction is known as being of the non-Schottky-type. The NFET transistor is now operational. By applying a sufficient positive gate-to-source voltage (referred to as the threshold voltage of the FET), the conductive channel appears: enough electrons must be attracted near the gate to counter the dopant ions added to layer 3, it first forms a region free of mobile carriers called a depletion region. Further gate-to-source voltage increase will attract even more electrons toward the gate, which are able to create the apparition of an excess of negative charges, this process is called inversion.

PFET Transistor

Figure 4:
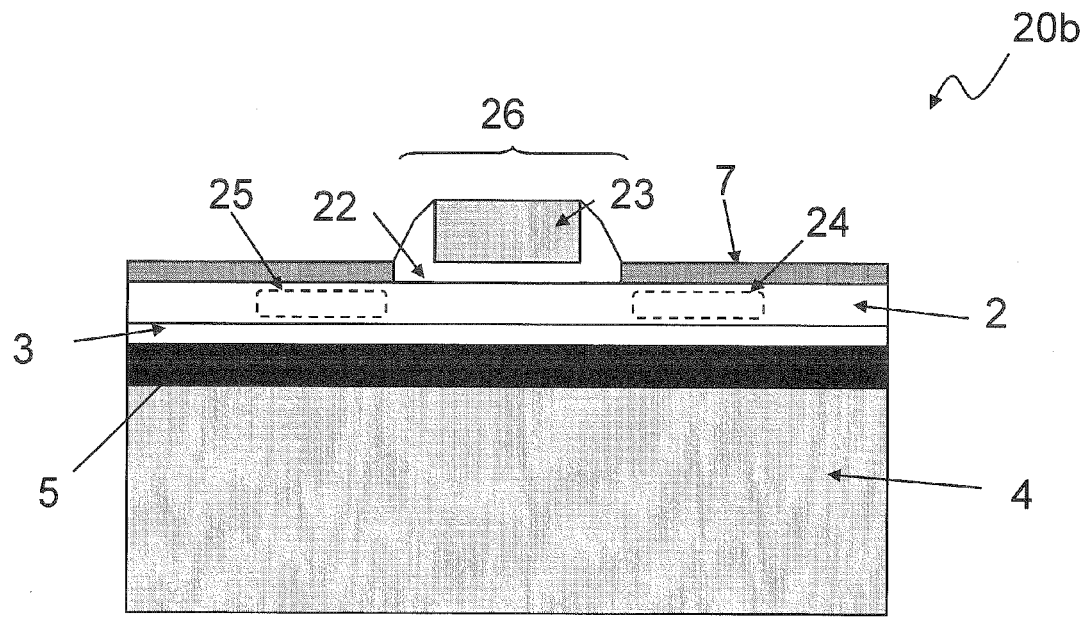
FIG. 4 is a transversal view of an embodiment of a PFET manufactured by an embodiment of a method according to the third aspect of the invention.

According to further aspects of the invention, a PFET transistor 20b manufactured from a Ge-III/V-OI structure 10 as previously described and a method for manufacturing such a PFET transistor 20b are respectively provided. Such a high-performance PFET transistor 20b is represented by the FIG. 4. In the P-type (positive) arrangement, the charge carriers are the holes. So, the semiconductor is N-doped (or undoped if operated under fully depleted condition), and when activated, a P-channel forms and current can circulate. This is a reverse functioning with respect to an NFET transistor.

To manufacture such a PFET transistor 20b, the Ge-III/V-OI structure 10 is formed in a first step. Then, an island 26 is formed on the germanium layer 2 and a layer of a high-K dielectric material 22 is first deposited. A gate 23 is then deposited. Gate 23 is preferably a metal gate. Indeed, for holes a high mobility layer is the germanium layer 2, so the germanium layer 2 is not separated into two parts. Advantageously, the germanium layer 2 is nevertheless partially recessed before forming the island 26. Thus, a thinner germanium channel will be easier to open. If there is a germanide buffer layer 7, a cavity is formed in layer 7 extending down to the germanium layer 2, in order to have the island 26 directly formed on the germanium layer 2. The gate 23 is advantageously made of metal, and is insulated from other layers by the high-K dielectric material 22.

Finally, a source region 24 and a drain region 25 are formed by implanting in the two parts of the germanium layer 2 on each side of the island 26. The PFET transistor is now operational. Similar to the NFET, by applying a sufficient positive gate-to-source voltage, the conductive channel appears: enough holes must be attracted from the InAsGa layer 3 to the germanium layer 2 to counter the dopant ions added.

What is claimed is:
1. A semiconductor structure including an N Field-Effect Transistor (NFET) formed in a germanium on III/V-On-Insulator (Ge-III/V-OI) structure comprising a support substrate, an insulating layer on the support substrate, at least one layer of III/V material on the insulating layer, and a germanium layer on the at least one layer of III/V material, wherein the NFET comprises:
- a gate in a cavity in the germanium layer extending to the at least one layer of III/V material, the gate being insulated from the germanium layer and the III/V layer(s) by a high-K dielectric material;
- a source region in the germanium layer on a first side portion of the cavity; and
- a drain region in the germanium layer on an opposite side portion of the cavity.

2. The semiconductor structure of claim 1, further comprising a P Field Effect Transistor (PFET) formed in the Ge-III/V-OI structure, wherein the PFET transistor comprises:
- an island on the germanium layer, the island comprising a gate insulated from the germanium layer by a high-K dielectric material;
- a source region in the germanium layer on a first side of the island; and
- a drain region in the germanium layer on another other side of the island.

3. The semiconductor structure according to claim 1, wherein the germanium layer is relaxed.

4. The semiconductor structure according to claim 1, wherein the III/V material is InP, AsGa, InAs or InGaAs.

5. The semiconductor structure according to claim 1, wherein the III/V material is InGaAs.

6. The semiconductor structure according to claim 1, wherein the support substrate is made of silicon and the insulating layer is an oxide.

7. The semiconductor structure according to claim 1, further comprising a cavity in the germanium layer extending to the at least one layer of III/V material.

8. The semiconductor structure according to claim 7, further comprising a high-K dielectric material in the cavity.

9. The semiconductor structure according to claim 8, further comprising a metal layer on the high-K dielectric material.

10. A method for manufacturing an N Field-Effect Transistor (NFET) in a germanium on III/V-On-Insulator (Ge-III/V-OI) structure comprising a support substrate, an insulating layer on the support substrate, at least one layer of III/V material on the insulating layer, and a germanium layer on the at least one layer of III/V material the NFET comprising a gate in a cavity in the germanium layer extending to the at least one layer of III/V material, the gate being insulated from the germanium layer and the III/V layer(s) by a high-K dielectric material, a source region in the germanium layer on a first side portion of the cavity, and a drain region in the germanium layer on an opposite side portion of the cavity, wherein the method comprises:
- providing a cavity in the germanium layer of the Ge-III/V-OI structure extending to the layer of III/V material;
- depositing in the cavity a high-K dielectric material and a gate, with the gate being insulated from the germanium layer and the layer of III/V material by the high-K dielectric material; and
- implanting a source region and a drain region in the germanium layer on each side of the cavity.

11. A method for manufacturing a P Field-Effect Transistor (PFET) formed in a Ge-III/V-OI structure comprising a support substrate, an insulating layer on the support substrate, at least one layer of III/V material on the insulating layer, and a germanium layer on the at least one layer of III/V material, the PFET transistor comprising an island on the germanium layer, the island comprising a gate insulated from the germanium layer by a high-K dielectric material, a source region in the germanium layer on a first side of the island, and a drain region in the germanium layer on another other side of the island, wherein the method comprises:
- forming an island on the germanium layer of the Ge-III/V-OI structure by depositing a high-K dielectric material and a gate, with the gate being insulated from the germanium layer by the high-K dielectric material; and
- implanting a source region and a drain region in the germanium layer on a side of the island.

12. The method according to claim 11, wherein the Ge-III/V-OI structure is formed by growing a silicon germanide buffer layer of lattice adaptation on the donor substrate, with the relaxed germanium layer being grown on the silicon germanide buffer layer, thereafter forming a cavity in the buffer layer that extends to the germanium layer before forming the island, with the gate being insulated from the buffer layer by the high-K dielectric material.

13. The method according claim 11, which further comprises partially recessing the germanium layer before forming the island.

* * * * *